(12) United States Patent
Versen et al.

(10) Patent No.: US 7,542,362 B2
(45) Date of Patent: Jun. 2, 2009

(54) SENSE-AMPLIFIER CIRCUIT FOR A MEMORY DEVICE WITH AN OPEN BIT LINE ARCHITECTURE

(75) Inventors: Martin Versen, Feldkirchen (DE); Helmut Schneider, Munich (DE)

(73) Assignee: Qimonda AG, Munich (DE)

( * ) Notice: Subject to any disclaimer, the term of this patent is extended or adjusted under 35 U.S.C. 154(b) by 44 days.

(21) Appl. No.: 11/872,573

(22) Filed: Oct. 15, 2007

(65) Prior Publication Data

US 2009/0097347 A1    Apr. 16, 2009

(51) Int. Cl.
*G11C 7/00* (2006.01)

(52) U.S. Cl. ............... 365/205; 365/189.05; 365/210.1; 365/230.03

(58) Field of Classification Search .................. 365/205, 365/189.16, 210.1, 145, 207, 189.05, 230.03
See application file for complete search history.

(56) References Cited

U.S. PATENT DOCUMENTS

| 7,177,216 B2 * | 2/2007 | Suh et al. ..................... 365/205 |
| 2006/0181946 A1 * | 8/2006 | Park et al. .................... 365/210 |
| 2006/0215472 A1 * | 9/2006 | Yoon et al. ................... 365/207 |

* cited by examiner

Primary Examiner—Tuan T Nguyen
Assistant Examiner—Toan Le
(74) Attorney, Agent, or Firm—Slater & Matsil, L.L.P.

(57) ABSTRACT

A device for accessing a logical content of a memory cell, the memory cell including a cell capacity for storing a charge related to the logical content, wherein the cell capacity is connected between a bit line having a bit line capacity and a reference potential, the device including: a reference node having a reference capacity being smaller than the bit line capacity; and a circuit for changing a potential of the bit line and the reference node, respectively, in case of a read or write access of the memory cell, wherein the change of the potential of the bit line is conducted with a first current and the change of the potential of the reference node is conducted with a second current, wherein the first current is greater than the second current.

25 Claims, 11 Drawing Sheets

SENSE-AMPLIFIER CIRCUIT FOR A MEMORY DEVICE WITH AN OPEN BIT LINE ARCHITECTURE

TECHNICAL FIELD

Embodiments of the present invention relate in general to semiconductor memory devices and, more particularly, to a sense-amplifier circuit for accessing contents of memory cells included in an edge sub-array of a memory cell array.

BACKGROUND

Architecture of semiconductor memories is roughly divided into two types, namely, open bit line architecture and folded bit line architecture.

In memory devices having memory cell arrays with an open bit line architecture, sense-amplifiers are commonly disposed between sub-arrays of the memory cell arrays. Thereby, each sense-amplifier is commonly connected to two bit lines. The two bit lines, in the following referred to as active bit line and reference bit line, are each connected to memory cells included in two different adjacent sub-arrays of a memory cell array. Further, in the memory cell array having an open bit line architecture, an edge sub-array, i.e., a sub-array that is positioned on the edge, or perimeter, of the memory cell array, has dummy bit lines that are interleaved with normal bit lines. Memory cells connected to the dummy bit lines do not store data during normal operation. Hence, the memory cell efficiency in these edge sub-arrays is reduced from 100% to 50%. These 50% memory cell sub-arrays lead to additional chip area, which makes the memory device more expensive.

Hence, it would be desirable to provide an embodiment to avoid those 50% memory cell sub-arrays with dummy bit lines in order to save chip area for memory device.

BRIEF DESCRIPTION OF THE DRAWINGS

In the following, embodiments of the present invention are explained in more detail with reference to the accompanying drawings, in which.

DETAILED DESCRIPTION OF ILLUSTRATIVE EMBODIMENTS

Figure 1:
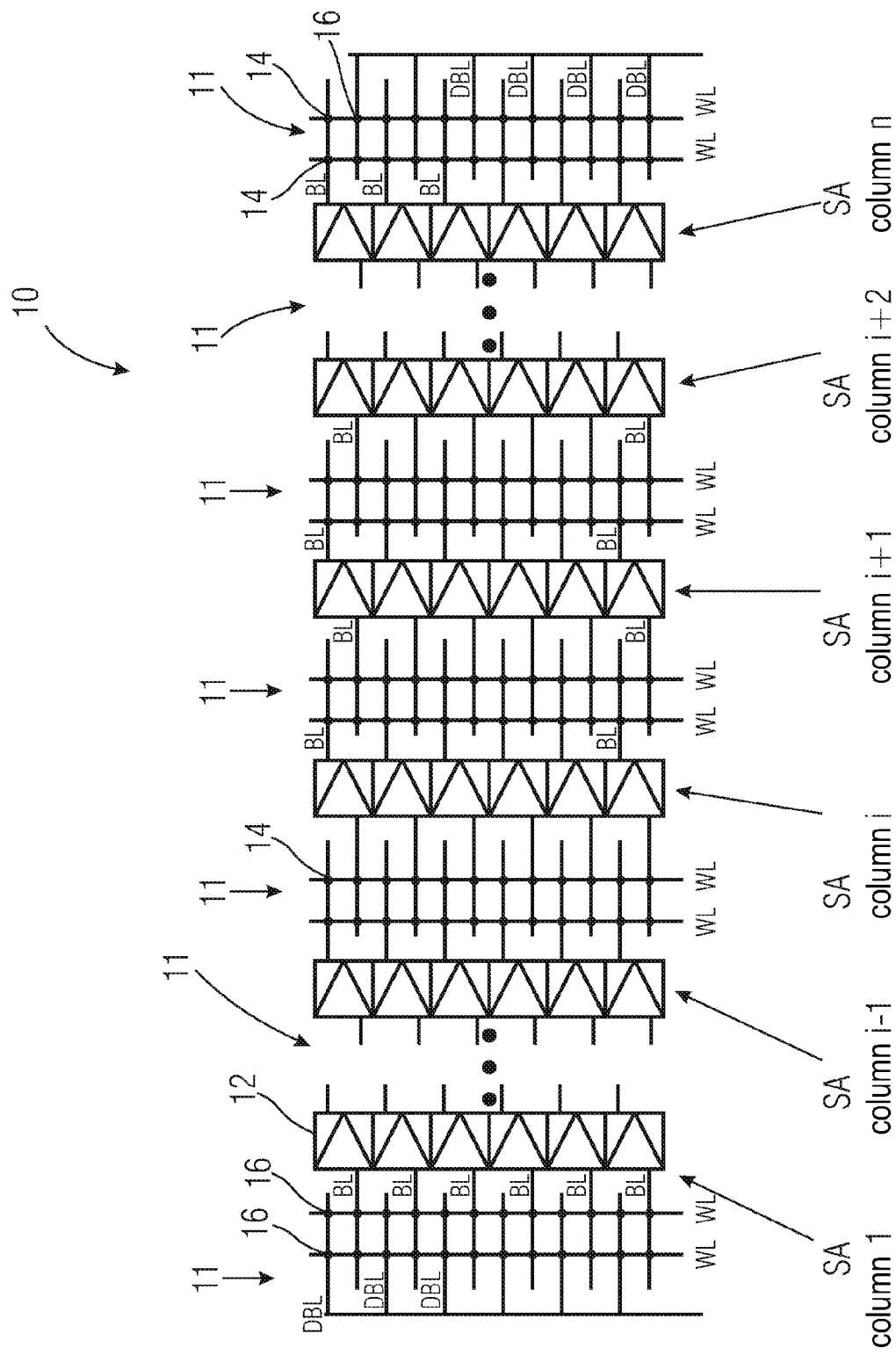
FIG. 1 shows a block diagram of a memory cell array with open bit line architecture for a memory bank.

With regard to the following description, it should be noted that in the different embodiments equally operating functional elements have the same reference numerals and thus descriptions of those functional elements are exchangeable in the different embodiments illustrated in the following.

FIG. 1 shows a memory cell array 10 having a plurality of memory cell sub-arrays 11 divided by a plurality of columns of sense-amplifiers, each column of sense-amplifiers comprising a plurality of sense-amplifiers 12. Each memory cell sub-array 11 comprises a plurality of bit lines BL in an open bit line architecture, which means that each second bit line BL is connected to one of the sense-amplifiers 12 of the sense-amplifier column defining a first boundary of the memory cell sub-array 11 and the remaining bit lines BL of the memory cell sub-array 11 are connected to sense-amplifiers 12 of the sense-amplifier column defining a second boundary of the memory cell sub-array. Further, all bit lines BL of a memory cell sub-array 11 are connected to word lines WL, each intersection of a word line WL and bit line BL being related to a memory cell 14.

The outermost memory cell sub-arrays, i.e., the edge memory cell sub-arrays, comprise bit lines BL and dummy bit lines DBL, wherein dummy memory cells 16 connected to the dummy bit lines DBL do not store any data during normal operation. Hence, the memory cell efficiency in the edge memory cell sub-arrays is decreased to 50%.

As can be seen from FIG. 1, each sense-amplifier 12 of the memory cell array 10 comprises inputs for two bit lines, wherein the one of the two bit lines BL not being connected to the memory cell, which shall be accessed by the sense-amplifier 12, serves as a reference bit line and the bit line connected to the memory cell to be accessed, serves as an active bit line.

Typically, in each case of a memory cell access, the two bit lines are connected to the related sense-amplifier 12. The sense-amplifier 12 operates differentially and compares the potentials on the two bit lines BL which are connected to it. Activation of a word line WL results in one of the two bit lines, the active bit line, being connected to the memory cell 14, 16 to be accessed. The other bit line, which is connected to the same sense-amplifier, is used as a reference bit line, to which no memory cell is generally connected by means of an activated word line WL.

Before the activation of a word line WL, all of the bit lines BL are set to a bit line mid-potential Vbleq in a precharging or pre-charge process, with this mid-potential being between a bit line high potential Vblh and a bit line low potential Vbll.

After the activation of the word line WL, the connection of the active bit line to the memory cell 14, 16 which is associated with the crossing point between the active bit line and the word line WL results in a small potential difference, caused by the charge stored in the memory cell 14, 16. This small potential difference is amplified by the sense-amplifier 12. In this case, one of the two bit lines adopts the high potential Vblh and the other adopts the low potential Vbll, depending on the charge or information that is stored in that memory cell 14, 16. At the same time, this results in the charge that is stored in the memory cell 14, 16 being refreshed.

When the memory cell 14, 16 is disconnected from the active bit line again by deactivation of the word line WL, both bit lines are precharged again, and are set to the mid-potential Vbleq. In this case, the two bit lines which are connected to the sense-amplifier 12 are short-circuited to one another by means of a switch. If the electrostatic capacitance of the two bit lines is approximately the same, this results in a potential approximately in the center between the high potential Vblh and the low potential Vbll, which corresponds to the mid-potential Vbleq. In order to compensate for small asymmetries, both bit lines are, furthermore, connected at the same time or subsequently via switches that are provided for this purpose to a Vbleq network, which provides the mid-potential Vbleq.

As aforementioned, it would be desirable to avoid the 50% cell efficiency memory cell edge sub-arrays 11 depicted on the left and right edges of the memory cell array of FIG. 1 in order to save chip area. For this purpose, embodiments of the present invention provide a memory chip, an edge area of which is schematically depicted in FIG. 2.

Figure 2:
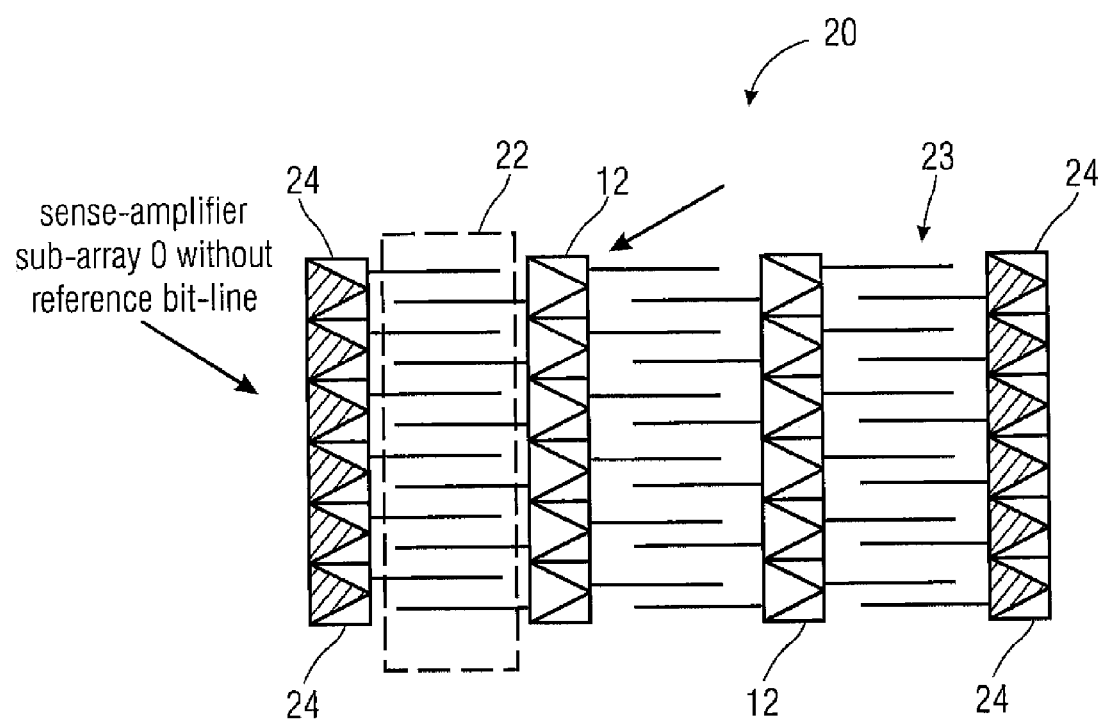
FIG. 2 shows an edge memory cell sub-array with a sense-amplifier column without dummy bit lines according to an embodiment of the present invention.

FIG. 2 shows a memory chip according to embodiments of the present invention, the memory chip having a memory cell array 20 with an open bit line architecture between a first memory cell sub-array 22 and a last memory cell sub-array 23 with first and last related sense-amplifiers 24 forming boundaries of the memory cell array 20, wherein the first and the last related sense-amplifiers 24 are connected to bit lines BL of the first and last memory cell sub-arrays 22, 23, respectively, and wherein reference bit lines are not provided for the first and last related sense-amplifiers 24. In other words, the first and last related sense-amplifiers 24 only provide inputs for active bit lines.

Since no reference bit lines are necessary for the first and the last sense-amplifiers 24, the 50% cell efficiency memory cell edge sub-arrays depicted in FIG. 1 can be omitted for the memory chip with the memory cell array 20. Hence, the memory cell efficiency, which is directly related to chip area, can be increased with embodiments of the present invention.

Figure 3:
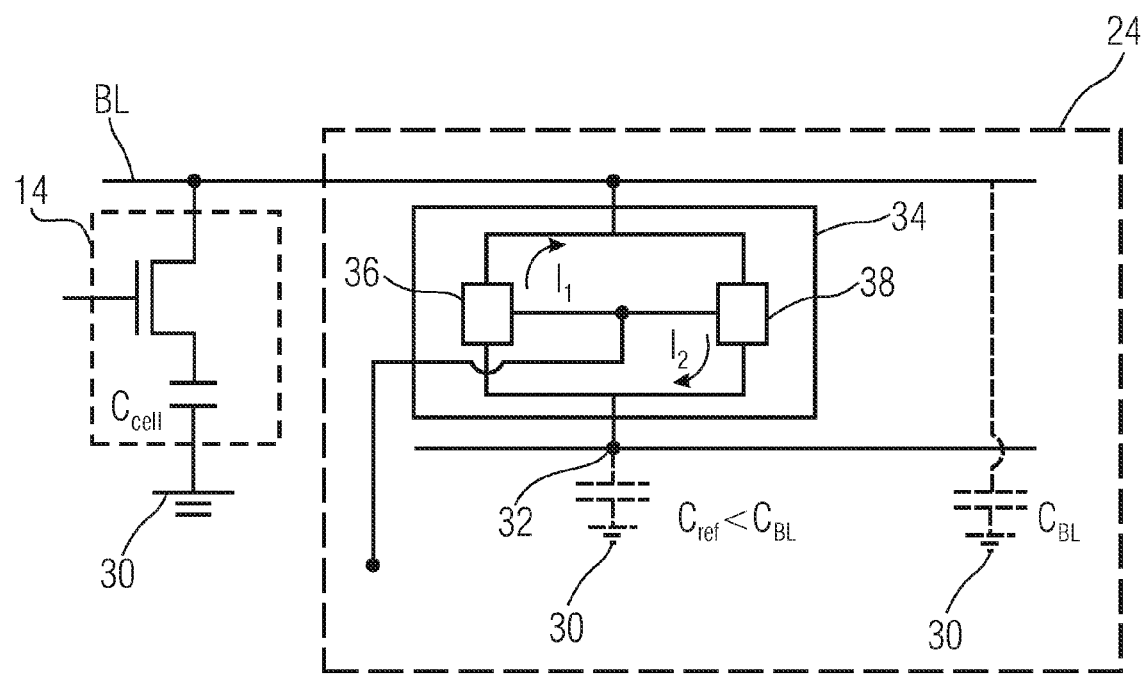
FIG. 3 shows a block diagram of a device for accessing logical content of a memory cell according to an embodiment of the present invention.

A schematic block diagram of parts of an embodiment of one of the first or the last related sense-amplifiers 24 is shown in FIG. 3.

FIG. 3 shows an embodiment of the sense-amplifier 24 for accessing a logical content of a memory cell 14, the memory cell 14 comprising a cell capacity (capacitance) $C_{cell}$ for storing a charge related to the logical content, wherein the cell capacity $C_{cell}$ is connected between an (active) bit line BL having a bit line capacity $C_{BL}$ and a reference potential 30, e.g., a ground potential. The sense-amplifier 24 comprises a reference node 32 having a reference capacity $C_{ref}$ being smaller than the bit line capacity $C_{BL}$. According to embodiments of the present invention, the reference capacity $C_{ref}$ is equal to or smaller than the bit line capacity $C_{BL}$ divided by a factor of 2, that is $C_{ref} < C_{BL}/2$. Here, the bit line capacity $C_{BL}$ and the reference capacity $C_{ref}$ are typically formed by electrostatic capacitances of the bit line BL and the reference node 32 against the reference or ground potential, respectively.

Further, the sense-amplifier 24 comprises a circuit 34 for changing a potential of the (active) bit line BL and the reference node 32, respectively, in case of a read or write access of the memory cell 14, wherein the change of the potential of the (active) bit line BL is conducted with a first current $I_1$ and the change of the potential of the reference node 32 is conducted with a second current $I_2$, wherein the first current $I_1$ is greater than the second current $I_2$, i.e., $I_1 > I_2$. According to embodiments of the present invention $I_1$ is equal to or higher than the second current $I_2$ multiplied by a factor of 2, that is $I_1 \geq 2I_2$.

During the change of the potentials of the (active) bit line BL and the reference node 32 the first current $I_1$ and the second current $I_2$ can reach maximum absolute values, respectively. In one aspect the circuit 34 is dimensioned such that, during the change of the potentials, the maximum absolute value of the first current $I_1$ is greater than the maximum absolute value of second current $I_2$, and, in particular, the maximum absolute value of $I_1$ is equal to or higher than the maximum absolute value of $I_2$ multiplied by a factor of 2 according to embodiments of the present invention.

In another aspect the circuit 34 is dimensioned such that an average first current $I_1$ is at least two times higher than an average second current $I_2$. The average currents are determined by averaging the actual currents in the period of change of the potentials, i.e., when the potential on the bit line BL changes from a first bit line potential to a second bit line potential.

According to embodiments of the present invention, a ratio $I_2/I_1$ between the second current $I_2$ and the first current $I_1$ has a value in a predefined range of a ratio $C_{ref}/(C_{BL}+C_{cell})$ between the reference capacity $C_{ref}$ and the bit line capacity $C_{BL}$ plus the cell capacity $C_{cell}$, i.e., $$A \frac{C_{ref}}{C_{BL} + C_{cell}} < \frac{I_2}{I_1} < B \frac{C_{ref}}{C_{BL} + C_{cell}}, \qquad (1)$$

wherein A<1<B, e.g. A=0.8 and B=1.2.

In order to control the first and second current $I_1$, $I_2$, the circuit 34 for changing a potential of the (active) bit line BL and the reference node 32 comprises means 36, 38 to control the absolute value of the first current $I_1$ and the absolute value second current $I_2$, respectively. The means 36,38 could comprise transistors, resistors, voltage controlled current sources and other means for controlling and determining current strengths.

Figure 4:
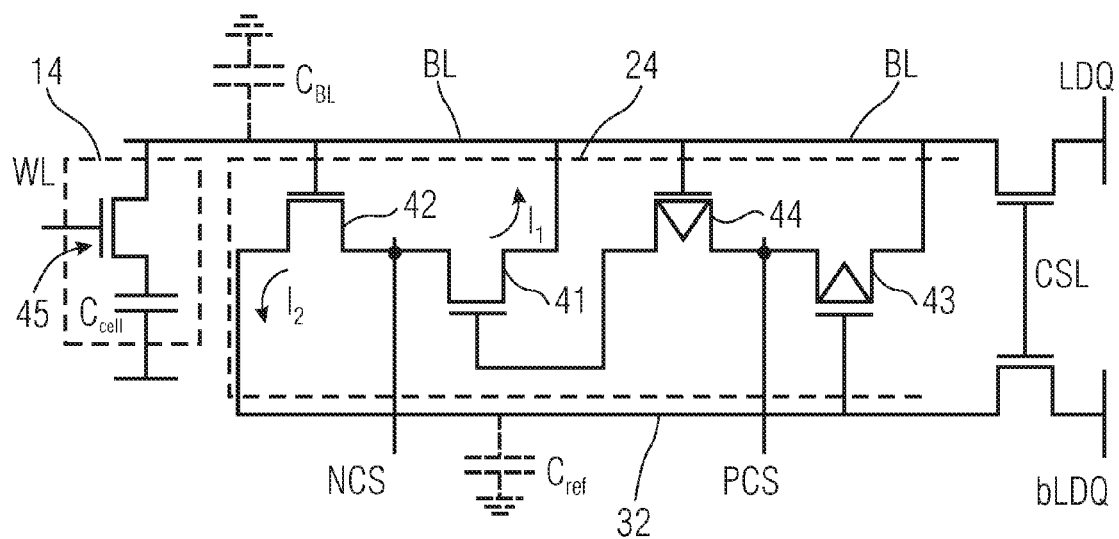
FIG. 4 shows a circuit diagram of a device for accessing logical content of a memory cell according to an embodiment of the present invention.

Referring now to FIG. 4, a further embodiment of the sense-amplifier 24 is shown in part, comprising a first NMOS-transistor 41, a second NMOS-transistor 42, a first PMOS-transistor 43 and a second PMOS-transistor 44, wherein the first NMOS-transistor 41 and/or the first PMOS-transistor 43 controls the change of the potential of the (active) bit line BL and wherein the second NMOS-transistor 42 and/or the second PMOS-transistor 44 controls the change of the potential of the reference node 32. The source terminals of the first NMOS- and PMOS-transistors 41, 43 are both connected to the (active) bit line BL, the drain terminals of the first NMOS- and PMOS-transistors 41, 43 are both connected to the respective drain terminals of the second NMOS- and PMOS-transistors 42, 44. The gate terminals of the second NMOS- and PMOS-transistors 42,44 are both connected to the (active) bit line BL, whereas the gate terminal of the first PMOS-transistor 43 is connected to the reference node 32 and whereas the gate terminal of the first NMOS-transistor 41 is connected to the source terminal of the second PMOS-transistor 44. Further, the drain terminal of the first NMOS-transistor 41 is connected to a bit line low potential, i.e., NCS=Vbll, in case of a read access and connected to a precharge potential, i.e. NCS=Vbleq, in case of precharge or standby. The drain terminal of the first PMOS-transistor 43 is connected to the precharge potential, i.e., PCS=Vbleq, in case of precharge or standby and connected to a bit line high potential, i.e. PCS=Vblh, in case of a read access of the memory cell 14.

The write access is controlled by the CSL transistors. Data for the write access are obtained via LDQ and bLDQ pins.

According to embodiments of the present invention a ratio of a drain-source-channel-width between the second and the first NMOS-transistor 42, 41 and the second and the first PMOS-transistor 44, 43, respectively, is in a predetermined range of a ratio between the reference capacity $C_{ref}$ and the bitline capacity $C_{BL}$ plus cell capacity $C_{cell}$, i.e., $$C \frac{C_{ref}}{C_{BL} + C_{cell}} < \frac{W_2}{W_1} < D \frac{C_{ref}}{C_{BL} + C_{cell}}, \quad (2)$$

wherein C<1<D, e.g. C=0.8 and D=1.2, and wherein $C_{ref}$ denotes the reference capacity $C_{ref}$ of the reference node 32, $C_{BL}$ denotes the bit line capacity, $C_{cell}$ denotes the cell capacity of the memory cell 14, $W_1$ denotes the drain-source-channel-width of the first NMOS- and/or PMOS-transistor 41, 43 and $W_2$ denotes the drain-source-channel-width of the second NMOS- and/or PMOS-transistor 42, 44.

Assuming that a logical "1" is stored in the memory cell 14, the precharge potential Vbleq plus a voltage corresponding to the stored charge in the cell capacitor $C_{cell}$ is present on the bit line BL after turning on the transistor 45 connected to the word line WL. This increased bit line voltage turns on the second NMOS-transistor 42 (i.e., leads to an operation in its saturation region) leading to a potential of the reference node 32 equal to the bit line low potential Vbll, such that the first PMOS-transistor 43 is turned on connecting the bit line BL to the bit line high potential, i.e. PCS=Vblh. The second current $I_2$ through the second NMOS-transistor 42 reaches its maximum absolute value when the second NMOS-transistor 42 operates in its saturation region. Of course the same applies to the currents through the other MOS-transistors.

In case a logical "0" is stored in the memory cell 14, the precharge potential Vbleq minus a voltage difference corresponding to the charge of the cell capacitor $C_{cell}$ is present on the bit line BL. The second NMOS-transistor 42 therefore operates in its ohmic (or triode) region. The first NMOS-transistor 41, whose gate terminal has a potential approximately equal to the precharge potential Vbleq also leading to an ohmic operation region of the first NMOS-transistor 41, allows a first current $I_1$ from the bit line low potential Vbll (NCS) to the bit line BL. In order to allow a larger negative voltage gradient on the bit line than on the reference node 32, the first current $I_1$ has to be larger than the second current $I_2$. Since during a read or write access of the memory cell 14 the cell capacity $C_{cell}$ and the bit line capacity $C_{BL}$ are connected in parallel leading to a substantially higher sum-capacity ($C_{cell}+C_{BL}$) compared to the relatively small reference capacity $C_{ref}$, the first current $I_1$ charging the (active) bit line BL has to be substantially larger than the second current $I_2$ charging the reference node 32. Therefore, according to the embodiments of the invention, the ratio $I_2/I_1$ between the second current $I_2$ and the first current $I_1$ has to be approximately equal to $C_{ref}/(C_{BL}+C_{cell})$, as indicated by equation (1). In order to achieve this, the ratio $W_2/W_1$ of the drain-source-channel-width between the second and the first NMOS-transistor 42,41 and the second and the first PMOS-transistor 44,43, respectively, has to be approximately equal to $C_{ref}/(C_{BL}+C_{cell})$, as indicated by equation (2).

With the first current $I_1$ being substantially larger than the second current $I_2$, as aforementioned, the voltage on the (active) bit line BL drops faster than the voltage on the reference node 32, such that the second PMOS-transistor 44 is turned on, connecting the bit line high potential Vblh to the gate of the first NMOS-transistor 41 leading to a connection of the bit line low potential Vbll (NCS) to the (active) bit line BL.

With the device shown in FIG. 4 the reference node 32 cannot effectively be brought to the bit line high potential Vblh in case of read access of a stored logical "0" in the memory cell 14. Therefore, in this case the reference node 32 has a potential in the order of magnitude of the precharge potential Vbleq and feeds the (active) bit line BL additionally with a current from the bit line high potential Vblh (PCS) via the first PMOS-transistor 43 leading to an effective rise of the bit line low potential Vbll on the (active) bit line BL for a logical "0" in the memory cell 14. In order to establish a full voltage level between the (active) bit line BL and the reference node 32, and in order to decrease a current leakage of the device 24 shown in FIG. 4, the device 24 can be combined with another sense-amplifier structure, which is shown in FIG. 5.

Figure 5:
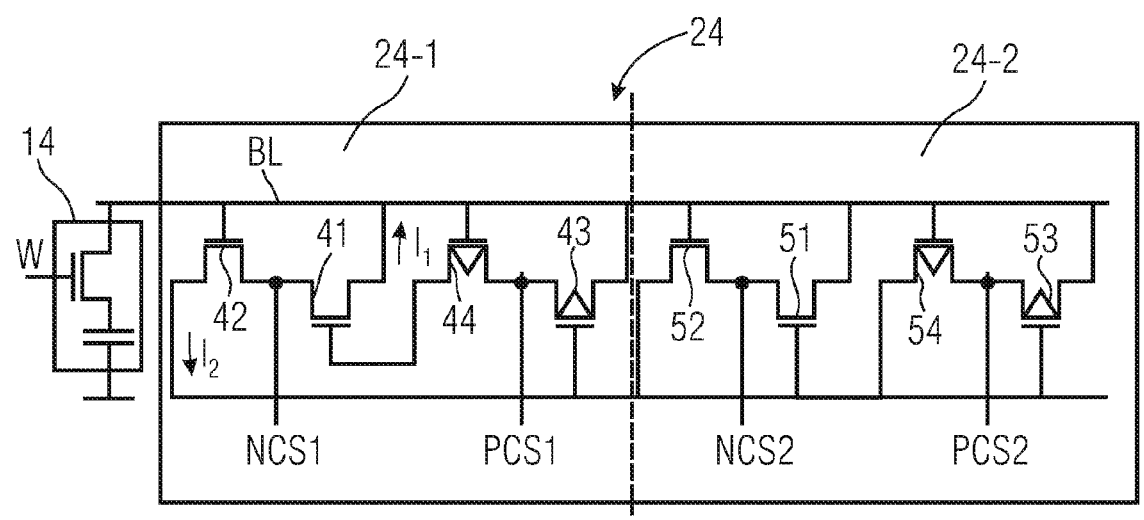
FIG. 5 shows a circuit diagram of a device for accessing logical content of a memory cell according to a further embodiment of the present invention.

FIG. 5 schematically shows a further embodiment of a sense-amplifier 24 according to the present invention which, compared to the sense-amplifier depicted in FIG. 4, additionally comprises a third NMOS-transistor 51, a third PMOS-transistor 53, a fourth NMOS-transistor 52 and a fourth PMOS-transistor 54, wherein the source terminals of the third NMOS- and PMOS-transistor 51, 53 are both connected to the (active) bit line BL, wherein the drain terminals of the third NMOS- and PMOS-transistor 51, 53 are connected to drain terminals of the fourth NMOS- and PMOS-transistor 52, 54, respectively. The gate terminals of the third NMOS- and PMOS-transistor 51, 53 are connected to the reference node 32, respectively. The source terminals of the fourth NMOS- and PMOS-transistor 52, 54 are both connected to the reference node 32 and the gate terminals of the fourth NMOS- and PMOS-transistor 52, 54, are both connected to the (active) bit line BL.

The drain terminal of the first NMOS-transistor 41 is connected to the bit line low potential, i.e. NCS1=Vbll, in case of a read access and connected to the precharge potential, i.e., NCS1=Vbleq, in case of precharge or standby. At the same time the drain terminal of the first PMOS-transistor 43 is connected to the precharge potential, i.e., PCS1=Vbleq, in case of precharge or standby and connected to the bit line high potential, i.e., PCS1=Vblh, in case of the read access. Within a predefined time period after a change of the drain potentials of the first and second NMOS- /PMOS-transistors 41, 42, 43, 44, the drain terminal of the third NMOS-transistor 51 is connected to the bit line low potential, i.e., NCS2=Vbll, in case of a read access and connected to the precharge potential, i.e., NCS2=Vbleq, in case of precharge or standby, and, at the same time, the drain terminal of the third PMOS-transistor 53 is connected to the precharge potential, i.e., PCS2=Vbleq, in case of precharge or standby and connected to the bit line high potential, i.e., PCS2=Vblh, in case of the read access. The two time instants separated by the predefined time period are denoted by xCS1 and xCS2 (x=N, P) in FIG. 5.

According to embodiments of the present invention, the predefined time period lies within about 2 ns and about 5 ns (ns=nanosecond). That is, the potentials of the drain terminal of the third and fourth transistors 51, 52, 53, 54 are changed within a predefined time between about 2 ns and about 5 ns after a change of the drain potential of the first and second transistors 41, 42, 43, 44.

A combination of the two sense-amplifier parts 24-1 and 24-2 allows, provided a delayed application of NCS2 and PCS2 compared to NCS1 and PCS1, an access of the memory cell content by a sense-amplifier according to the embodiment schematically depicted in FIG. 5 and the full development of the potential on the reference node 32. The embodiment of FIG. 5 allows a suppression of the aforementioned leakage currents and a full development of the potential of the reference node 32 at the same time.

Compared to a conventional sense-amplifier, the embodiment of the present invention schematically depicted in FIG. 5 is approximately double the size. However, if used as a sense-amplifier 24 for the 100%-efficiency edge memory cell sub-arrays 22, 23 of the memory cell array 20 of FIG. 2, chip area of a memory chip can still be saved since edge memory cell sub-arrays with a cell efficiency of 50% (FIG. 1) can be avoided.

Figure 6:
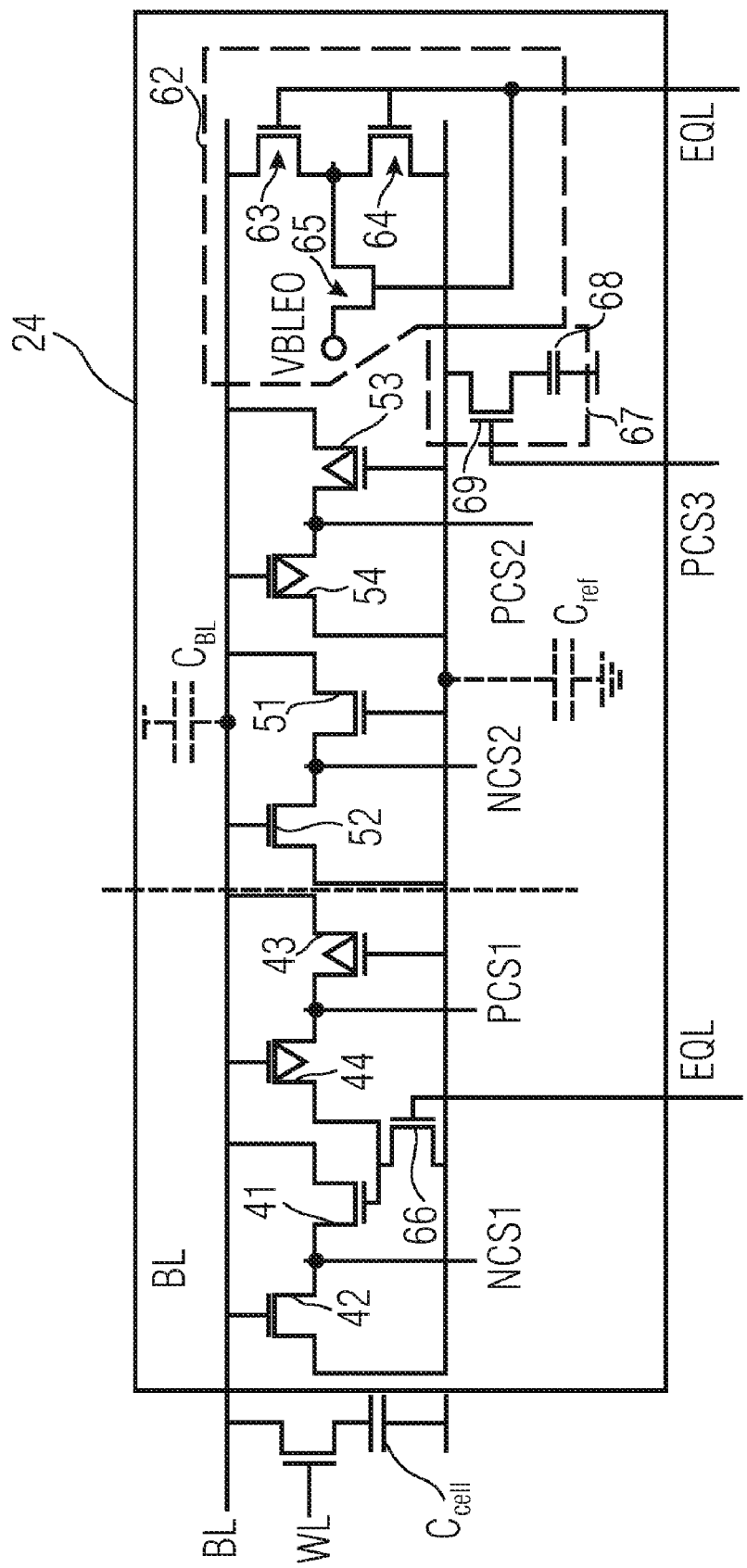
FIG. 6 shows a circuit diagram of a device for accessing logical content of a memory cell according to a further embodiment of the present invention.

FIG. 6 shows a further embodiment of a sense-amplifier according to the present invention.

The sense-amplifier 24 comprises a circuit 62 to improve the precharge behavior of the sense-amplifier 24. The circuit 62 comprises two NMOS-transistors 63, 64 with their drain terminals connected together and to a source terminal of an NMOS-transistor 65 having its drain terminal connected to the precharge potential Vbleq. The source terminal of the NMOS-transistor 63 is connected to the (active) bit line BL, wherein the source terminal of the NMOS-transistor 64 is connected to the reference node 32. The gate terminals of the NMOS-transistors 63, 64 and 65 are connected to an EQL signal. Setting the EQL signal into a high state leads to precharging the (active) bit line BL and the reference node 32 to the precharge potential Vbleq, respectively.

In order to set the potential applied to the gate terminal of the first NMOS-transistor 41 to a predefined level during the precharge process controlled by the EQL signal, the sense-amplifier 24 comprises a further NMOS-transistor 66 with its drain-source terminals connected between the gate terminal of the first NMOS-transistor 41 and the reference node 32, and its gate terminal connected to the control signal EQL controlling the precharge process between the reference node 32 and the (active) bit line BL.

Further, the sense-amplifier 24 shown in FIG. 6 provides a circuit 67 for equalizing the reference capacity $C_{ref}$ of the reference node 32 and the bit line capacity $C_{BL}$ during or after accessing the memory cell 14. According to embodiments of the present invention, the circuit 67 for equalizing the reference capacity $C_{ref}$ comprises a capacity 68 which can be connected between the reference node 32 and the reference or ground potential by means of a transistor 69 for a predefined time period during of after accessing the memory cell 14. The capacity 68 is used, as aforementioned, to equalize the bit line capacity $C_{BL}$ and the reference capacity $C_{ref}$ of the reference node 32, i.e., the capacity 68 may have a value of approximately ($C_{BL}-C_{ref}$). If, for example, the bit line capacity $C_{BL}$ has a nominal value of, e.g., 50 fF (fF=femto-Farad) and the reference capacity $C_{ref}$ as a nominal value of, e.g., 10 fF, the capacity 68 will be dimensioned to have approximately 40 fF. The capacity 68 is charged during or after the sensing process, i.e., during or after accessing the memory cell 14, with the PCS2- or the PCS3-signal.

If the word line WL has been closed after the sensing process, the sense-amplifier 24 is brought to the precharge potential Vbleq with the EQL signal. Thereby, the (active) bit line BL is shortcut with the reference node 32 by means of the circuit 62. In a sense-amplifier with reference bit line an equalized condition, i.e., the potential of the active bit line equals the potential of the reference bit line, is reached rather quickly, since the bit line capacity $C_{BL}$ and the capacity of a reference bit line are approximately equal in such a sense-amplifier.

However, this is not the case with embodiments of the present invention. In order to enlarge the reference capacity $C_{ref}$ of the reference node 32, the capacity 68 is connected to PCS3 in embodiments of the present invention. The PCS3 signal is set down to the precharge potential Vbleq only after the equalizing process in order not to cause any current leakage during standby. This has to be done within a row precharge time (tRP) or a number of clock cycles needed to terminate access to an open row of memory, and open access to the next row, in order to be able to activate a next word line without any disturbance. The time constant tRP determines the output resistance of a precharge current limiter of the sense-amplifier 24.

After various embodiments of the present invention have been described in the preceding sections of this specification, simulation results, comparing a sense-amplifier with a reference bit line with a sense-amplifier without a reference bit line according to an embodiment of the present invention, shall be presented in the following.

Figure 7:
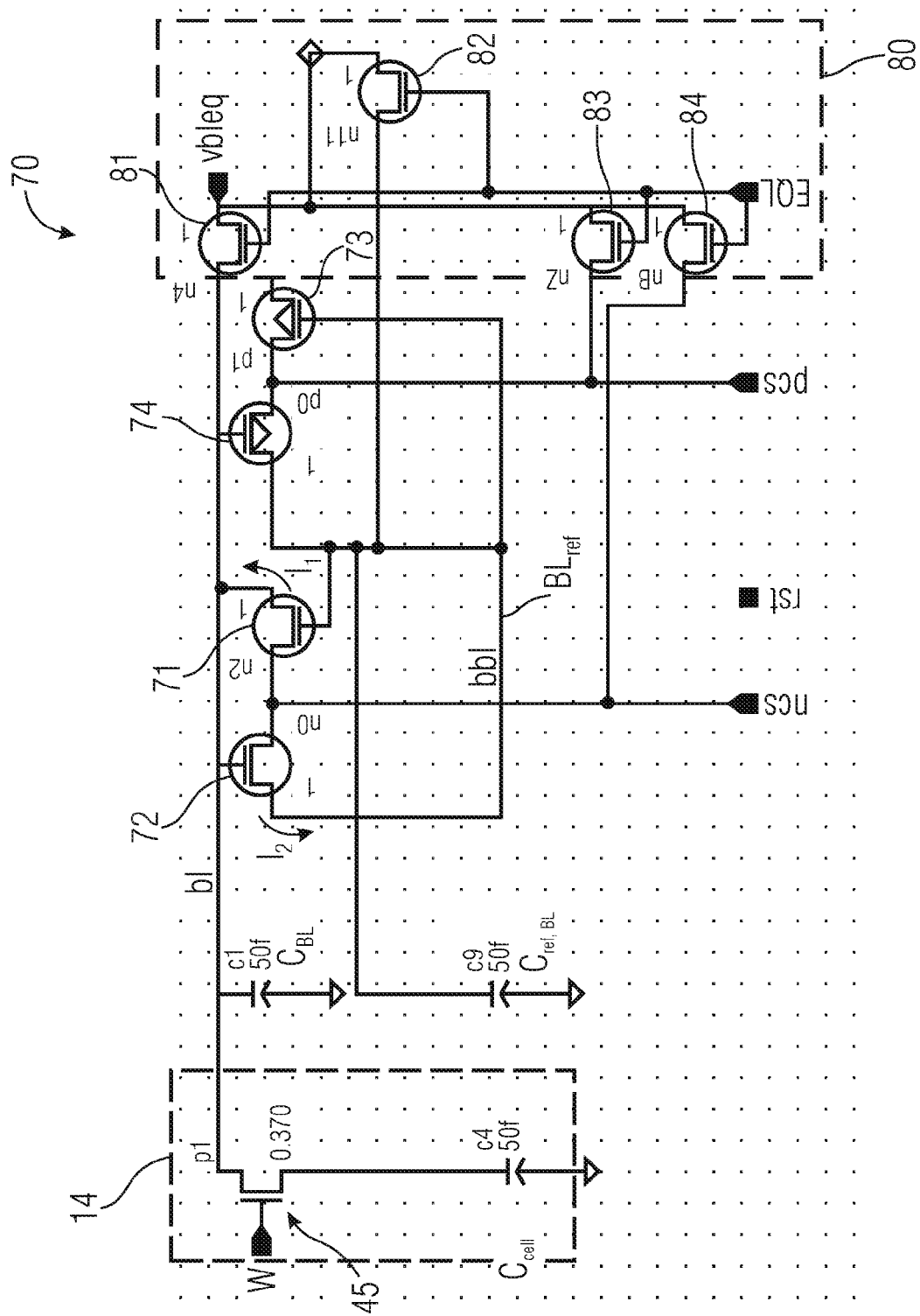
FIG. 7 shows a circuit diagram for the simulation of a sense-amplifier.

FIG. 7 shows a circuit diagram 70 for simulating a sense-amplifier with reference bit line.

FIG. 7 depicts a memory cell 14 with a cell capacity $C_{cell}$ connected to the active bit line BL by means of the transistor 45 having its gate terminal connected to the word line WL. The active bit line BL is simulated having a bit line capacity $C_{BL}$ of 50 fF. A reference bit line $BL_{ref}$ is also simulated to have a reference bit line capacity $C_{ref,BL}$ of 50 fF. The sense-amplifier with reference bit line comprises a first NMOS-transistor 71, a second NMOS-transistor 72, a first PMOS-transistor 73 and a second PMOS-transistor 74. The transistors 71 to 74 are connected to the active bit line and to the reference bit line as described with respect to FIG. 4, wherein at the gate terminal of the first NMOS-transistor is also connected to the reference bit line $BL_{ref}$. Here, the ratio $W_2/W_1$ of the drain-source-channel-width between the second and the first NMOS-transistor 72, 71 and the second and the first PMOS-transistor 74, 73, respectively, is approximately equal to 1 also leading to a ratio $I_2/I_1$ between the second current $I_2$ and the first current $I_1$ approximately equal to 1.

The sense-amplifier with reference bit line in the circuit diagram 70 comprises a precharge-and-equalize circuit 80 comprising four NMOS-transistors 81, 82, 83 and 84. The drain terminal of the NMOS-transistor 81 is connected to the precharge potential Vbleq, whereas the drain terminal of the NMOS-transistor 81 is connected to the active bit line BL. The gate terminal of the NMOS-transistor 81 is connected to the gate terminals of the NMOS-transistors 82, 83, 84 and the control signal EQL. The drain terminals of the NMOS-transistors 82, 83 and 84 are connected to the precharge potential Vbleq, respectively. The source terminal of the NMOS-transistor 82 is connected to the reference bit line $BL_{ref}$, the source terminal NMOS-transistor 83 is connected to the drain terminals of the first and second PMOS-transistors 73, 74 and the drain terminal of the NMOS-transistor 84 is connected to the drain terminals of the first and second NMOS-transistors 71, 72.

Using the precharge-and-equalize circuit 80, the potential of the active bit line BL, the reference bit line $BL_{ref}$ and the drain terminals of the first and second NMOS-transistors 71, 72 and first and second PMOS-transistors 73, 74 can be precharged to the precharge potential Vbleq during a precharge process controlled by the EQL signal.

Different start values for cell charges of the cell capacity $C_{cell}$ have been simulated. This has been done in order to evaluate critical cell charges leading to an amplified logical "0" and leading to an amplified logical "1".

Figure 8:
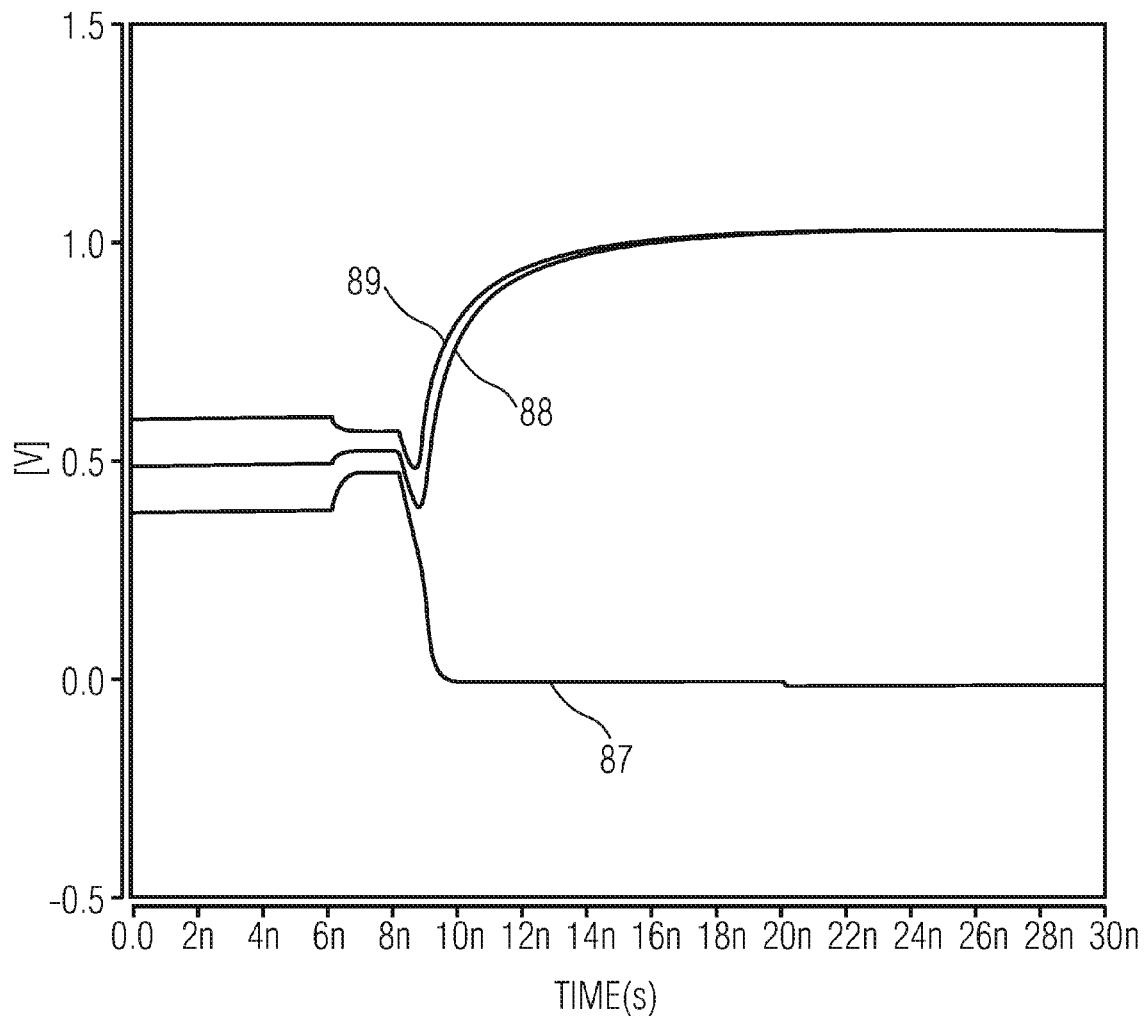
FIG. 8 shows a voltage-time-diagram of an active active bit line of the sense-amplifier according to FIG. 7.

FIG. 8 shows three voltage-time-diagrams for the cell voltage on the active bit line BL and the cell capacity $C_{cell}$ with start values of 400 mV (reference numeral 87), 450 mV (reference numeral 88), and 500 mV (reference numeral 89).

The start voltages 450 mV and 500 mV are below the precharge potential Vbleq of 550 mV, hence representing to a logical "0" stored in the memory cell 14. However, for both 450 mV and 500 mV a logical "1" is amplified. For values smaller than or equal to 400 mV, a logical "0" is expected and also successfully amplified.

Figure 9:
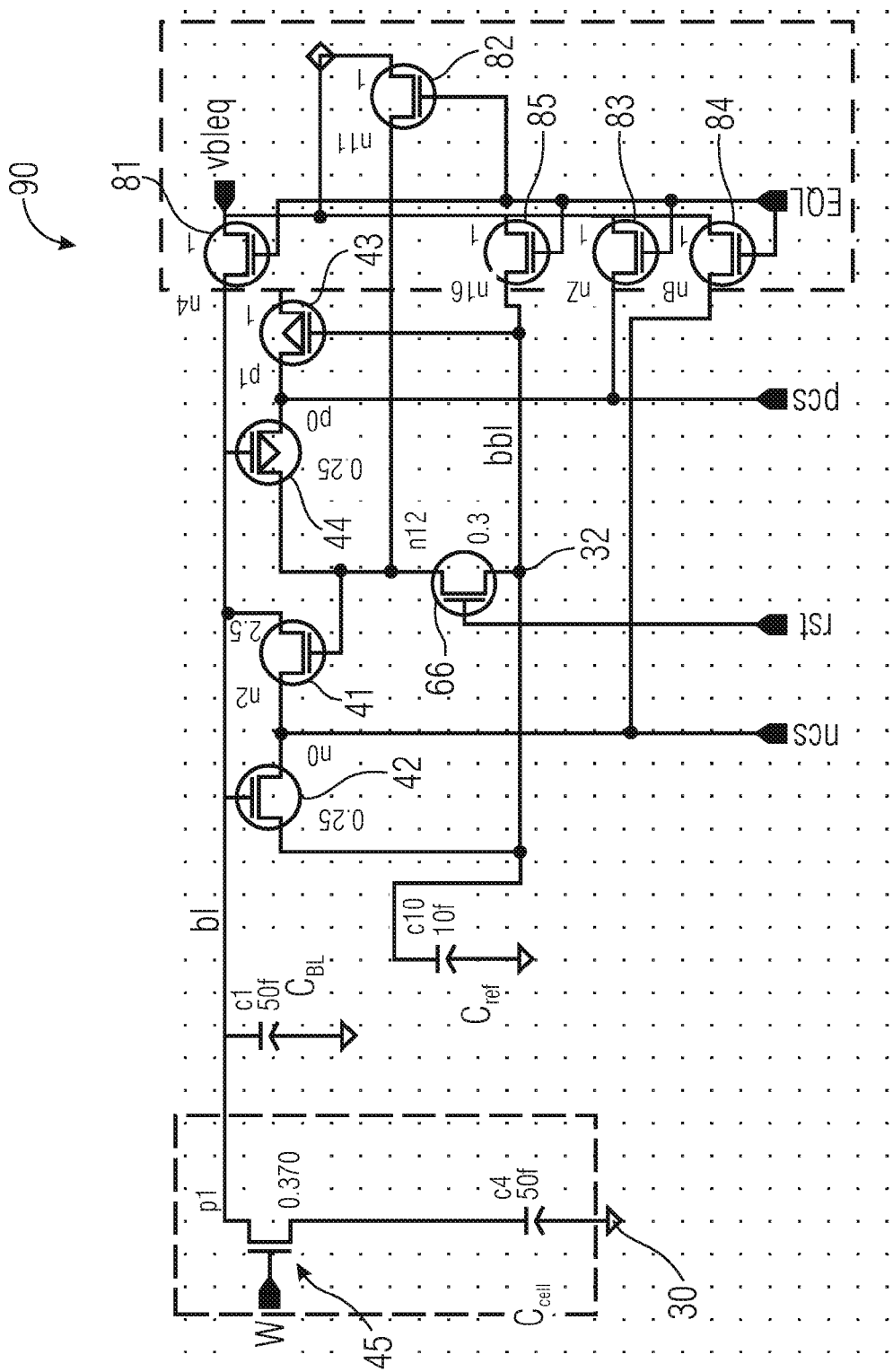
FIG. 9 shows a circuit diagram for the simulation of a sense-amplifier according to an embodiment of the present invention.

FIG. 9 shows a circuit diagram 90 for simulating a sense-amplifier 24 according to an embodiment of the present invention.

Here, the active bit line BL has a bit line capacity $C_{BL}$ of 50 fF, whereas the reference node 32 has a reference capacity $C_{ref}$ of 10 fF. The reference capacity $C_{ref}$ can, e.g., be formed by a gate-capacity of a MOS-transistor. To compensate the asymmetric, capacitive loads, the drain-source-channel-widths of the transistors 41, 42, 43, 44 have been adapted such that the ratio between the second current $I_2$ and the first current $I_1$ has a value in a predefined range of the ratio between the reference capacity $C_{ref}$ and the bit line capacity $C_{BL}$ plus the cell capacity $C_{cell}$, i.e., $I_2I_1 \approx C_{ref}/(C_{BL}+C_{cell})$. In return, the ratio of the drain-source-channel-width between the second NMOS-transistor 42 and the first NMOS-transistor 41 and the second PMOS-transistor 44 and the first PMOS-transistor 43, respectively, is in a predetermined range of a ratio between the reference capacity $C_{ref}$ and the bit line capacity $C_{BL}$ plus the cell capacity $C_{cell}$, i.e. $W_2/W_1 \approx C_{ref}/(C_{BL}+C_{cell})$.

Figure 10:
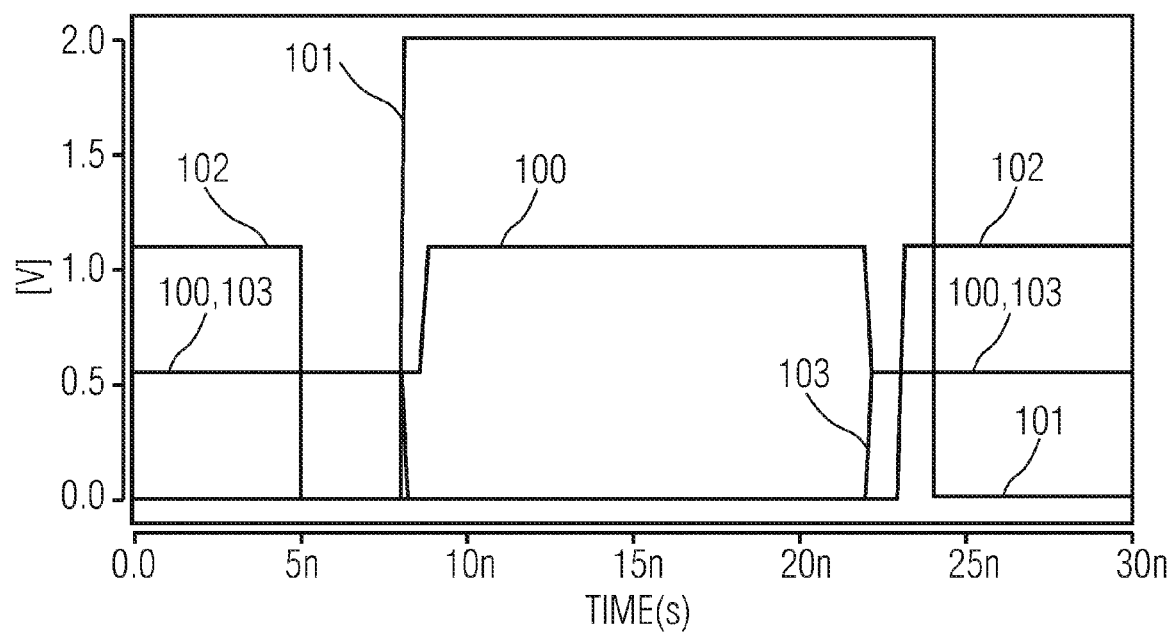
FIG. 10 shows a voltage-time-diagram of control signals for the sense-amplifier according to FIG. 9.

The simulation of the sense-amplifier in the circuit diagram 90 has been done according to the timing of the control signals depicted in FIG. 10.

The curve 100 depicts the timing of the voltage for the PCS signal. The curve 101 depicts the timing of the voltage for the RST signal. The curve 102 depicts the timing of the voltage for the EQL-signal and the curve 103 depicts the timing of the voltage for the NCS-signal.

Figure 11:
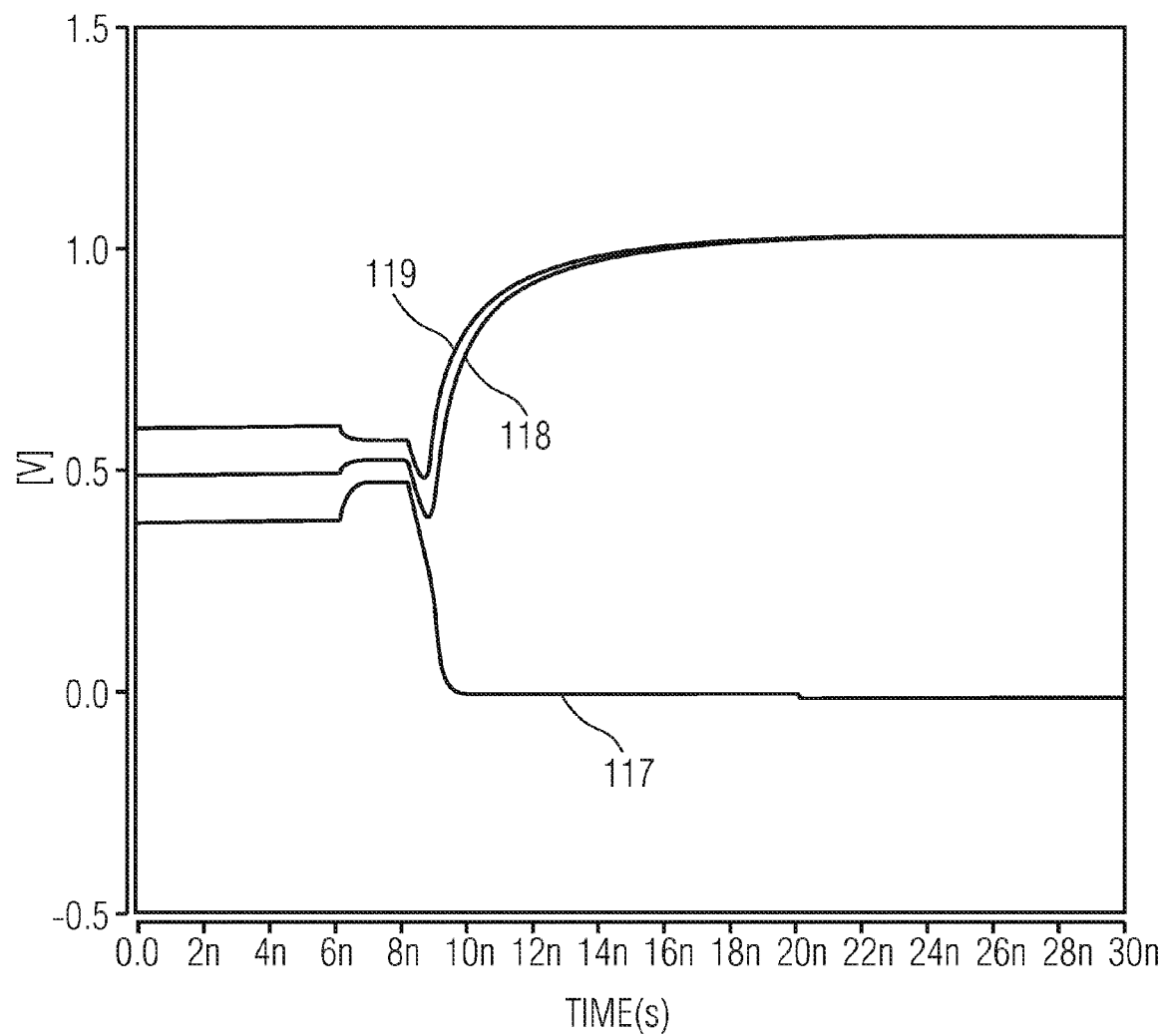
FIG. 11 shows a voltage-time-diagram of an active bit line for the simulated sense-amplifier according to FIG. 9.

FIG. 11 shows three voltage-time-diagrams for the cell voltage on the active bit line BL and the cell capacity C cell for the sense-amplifier according to FIG. 9 with start values of 400 mV (reference numeral 117), 450 mV (reference numeral 118), and 500 mV (reference numeral 119). The start voltages 450 mV and 500 mV are below the precharge potential Vbleq of 550 mV, hence representing a logical "0" stored in the memory cell 14. However, for both 450 mV and 500 mV a logical "1" is amplified. For values smaller than or equal to 400 mV, a logical "0" is expected and also successfully amplified. Hence, comparing FIG. 11 to FIG. 8 it can be seen that a sense-amplifier 24 according to an embodiment of the present invention behaves almost identically to the sense-amplifier 70 with reference bit line.

Hence, it has been shown that the asymmetric capacity ratio of the bit line capacity $C_{BL}$ and the reference capacity $C_{ref}$ of the reference node 32 can be compensated for by an adoption of the transistor drain-source-channel-width of the first and second NMOS-/PMOS-transistors 41, 42, 43 and 44.

While this invention has been described in terms of several preferred embodiments, there are alterations, permutations, and equivalents which fall within the scope of this invention. It should also be noted that there are many alternative ways of implementing the methods and compositions of the present invention. For example, NMOS-transistors can be easily replaced by PMOS-transistors where appropriate if inverse control signals are applied to the respective gate terminals. It is therefore intended that the following appended claims be interpreted as including all such alterations, permutations, and equivalents as fall within the true spirit and scope of the present invention.

What is claimed is:

1. A device for accessing a logical content of a memory cell, the memory cell comprising a cell capacity for storing a charge related to the logical content, wherein the cell capacity is connected between a bit line having a bit line capacity and a reference potential, the device comprising:
   a reference node having a reference capacity that is smaller than the bit line capacity; and
   a circuit for changing a potential of the bit line and the reference node, respectively, in case of a read or write access of the memory cell, wherein the change of the potential of the bit line is conducted with a first current and the change of the potential of the reference node is conducted with a second current, wherein the first current is greater than the second current.

2. The device according to claim 1, wherein the circuit for changing the potential of the bit line and the reference node is adapted to change of the potentials with the first current being equal to or higher than twice the second current.

3. The device according to claim 1, wherein the reference capacity is equal to or smaller than half the bit line capacity.

4. The device according to claim 1, wherein a ratio between the second current and the first current has a value in a range of a ratio between the reference capacity and the bit line capacity plus cell capacity, that is $$A \frac{C_{ref}}{C_{BL}+C_{cell}} < \frac{I_2}{I_1} < B \frac{C_{ref}}{C_{BL}+C_{cell}},$$

wherein A<1<B, $C_{ref}$ denotes the reference capacity of the reference node, $C_{BL}$ denotes the bit line capacity, $C_{cell}$ denotes the cell capacity of the memory cell, $I_1$ denotes the first current and $I_2$ denotes the second current.

5. The device according to claim 1, wherein the circuit comprises a first NMOS-transistor, a second NMOS-transistor, a first PMOS-transistor and a second PMOS-transistor, wherein the first NMOS- and/or the first PMOS-transistor controls the change of the potential of the bit line and wherein the second NMOS- and/or the second PMOS-transistor controls the change of the potential of the reference node.

6. The device according to claim 5, wherein source terminals of the first NMOS- and PMOS-transistors are both coupled to the bit line, drain terminals of the first NMOS- and PMOS-transistors are both coupled to respective drain terminals of the second NMOS- and PMOS-transistors, wherein gate terminals of the second NMOS- and PMOS-transistors are both coupled to the bit line, wherein a gate terminal of the first PMOS-transistor is coupled to the reference node, and wherein a gate terminal of the first NMOS-transistor is coupled to a source terminal of the second PMOS-transistor.

7. The device according to claim 6, wherein a ratio of a drain-source-channel-width between the second and the first NMOS-transistor and the second and the first PMOS-transistor, respectively, is in a range of a ratio between the reference capacity and the bit line capacity plus cell capacity, that is $$C \frac{C_{ref}}{C_{BL}+C_{cell}} < \frac{W_2}{W_1} < D \frac{C_{ref}}{C_{BL}+C_{cell}},$$

wherein C<1<D, $C_{ref}$ denotes the reference capacity of the reference node, $C_{BL}$ denotes the bit line capacity, C cell denotes the cell capacity of the memory cell, W I denotes the drain-source-channel-width of the first NMOS- and/ or PMOS-transistor and $W_2$ denotes the drain-source-channel-width of the second NMOS- and/or PMOS-transistor.

8. The device according to claim 7, wherein the drain terminal of the first NMOS-transistor is coupled to a bit line low potential in case of a read access and coupled to a precharge potential in case of a write access and wherein the drain terminal of the first PMOS-transistor is coupled to the precharge potential in case of the read access and coupled to a bit line high potential in case of the write access.

9. The device according to claim 6, wherein the circuit further comprises a third NMOS-transistor, a third PMOS-transistor, a fourth NMOS-transistor and a fourth PMOS-transistor, wherein source terminals of the third NMOS- and PMOS-transistors are both coupled to the bit line, wherein drain terminals of the third NMOS- and PMOS-transistors are coupled to drain terminals of the fourth NMOS- and PMOS-transistors, respectively, wherein gate terminals of the third NMOS- and PMOS-transistors are coupled to the reference node, and wherein source terminals of the fourth NMOS- and PMOS-transistors are both coupled to the reference node and gate terminals of the fourth NMOS- and PMOS-transistors are both coupled to the bit line.

10. The device according to claim 9, wherein the drain terminal of the third NMOS-transistor is coupled to a bit line low potential in case of a read access and coupled to a precharge potential in case of a write access, and wherein the drain terminal of the first PMOS-transistor is coupled to the precharge potential in case of the read access and coupled to a bit line high potential in case of the write access.

11. The device according to claim 10, wherein potentials of the drain terminal of the third and fourth transistors are changed within a predefined time period after a change of the drain potentials of the first and second transistors.

12. The device according to claim 11, wherein the predefined time period is less than or equal to about 5 ns.

13. The device according to claim 5, wherein the circuit comprises a fifth transistor with its drain-source-terminals coupled between a gate terminal of the first NMOS-transistor and the reference node and its gate terminal coupled to a control signal controlling a voltage equalizing process between the reference node and the bit line.

14. The device according to claim 1, wherein the circuit comprises a circuit for equalizing the reference capacity and the bit line capacity during or after accessing the memory cell.

15. The device according to claim 14, wherein the circuit for equalizing comprises a capacity connectable between the reference node and the reference potential for a predefined time period during or after accessing the memory cell.

16. The device according to claim 1, the device being a sense-amplifier only being connected to the bit line and not being connected to further bit lines for memory cells belonging to a different memory cell sub-array than the memory cell.

17. A sense-amplifier for accessing a logical content of a memory cell via a bit line, the sense-amplifier comprising:
 a reference node; and
 a circuit comprising a first NMOS-transistor, a second NMOS-transistor, a first PMOS-transistor and a second PMOS-transistor, wherein the first NMOS- and/or the first PMOS-transistor controls a change of a potential of the bit line in case of a read or write access of the memory cell and wherein the second NMOS- and/or the second PMOS-transistor controls a change of a potential of the reference node in case of a read or write access of the memory cell, wherein source terminals of the first NMOS- and PMOS-transistors are both coupled to the bit line, drain terminals of the first NMOS- and PMOS-transistors are both coupled to respective drain terminals of the second NMOS- and PMOS-transistors, wherein gate terminals of the second NMOS- and PMOS-transistors are both coupled to the bit line, wherein a gate terminal of the first PMOS-transistor is coupled to the reference node, and wherein a gate terminal of the first NMOS-transistor is coupled to the source terminal of the second PMOS-transistor.

18. The sense-amplifier according to claim 17, wherein a ratio of a drain-source-channel-width between the second and the first NMOS-transistor and the second and the first PMOS-transistor, respectively, is in a range of a ratio between a reference capacity of the reference node and a bit line capacity of the bit line plus a cell capacity of the memory cell, that is $$C\frac{C_{ref}}{C_{BL}+C_{cell}} < \frac{W_2}{W_1} < D\frac{C_{ref}}{C_{BL}+C_{cell}},$$

wherein $C<1<D$, $C_{ref}$ denotes the reference capacity of the reference node, $C_{bit}$ denotes the bit line capacity, $C_{cell}$ denotes the cell capacity of the memory cell, $W_1$ denotes the drain-source-channel-width of the first NMOS- and/or PMOS-transistor and $W_2$ denotes the drain-source-channel-width of the second NMOS- and/or PMOS-transistor.

19. The sense-amplifier according to claim 17, wherein the circuit further comprises a third NMOS-transistor, a third PMOS-transistor, a fourth NMOS-transistor and a fourth PMOS-transistor, wherein source terminals of the third NMOS- and PMOS-transistors are both coupled to the bit line, wherein drain terminals of the third NMOS- and PMOS-transistors are coupled to drain terminals of the fourth NMOS- and PMOS-transistors, respectively, wherein gate terminals of the third NMOS- and PMOS-transistors are coupled to the reference node, and wherein source terminals of the fourth NMOS- and PMOS-transistors are both coupled to the reference node and gate terminals of the fourth NMOS- and PMOS-transistors are both coupled to the bit line.

20. The sense-amplifier according to claim 19, wherein the drain terminal of the first NMOS-transistor is coupled to a bit line low potential in case of a read access and coupled to a precharge potential in case of a write access and wherein the drain terminal of the first PMOS-transistor is coupled to the precharge potential in case of the read access and coupled to a bit line high potential in case of the write access, and wherein, within a predefined time period after a change of the drain potentials of the first and second transistors, the drain terminal of the third NMOS-transistor is connected to a bit line low potential in case of a read access and connected to a precharge potential in case of a write access, and wherein the drain terminal of the first PMOS-transistor is connected to the precharge potential in case of the read access and connected to a bit line high potential in case of the write access.

21. The sense-amplifier according to claim 20, wherein the predefined time period is less than or equal to 5 ns.

22. The sense-amplifier according to claim 17, wherein the circuit comprises a fifth transistor with drain-source-terminals coupled between the gate terminal of the first NMOS-transistor and the reference node and a gate terminal coupled to a control signal controlling a voltage equalizing process between the reference node and the bit line.

23. A memory-chip having a memory cell array with an open bit line architecture between a first and a last memory cell sub-arrays and with first and last related sense-amplifiers forming boundaries of the memory cell array, wherein the first and the last related sense-amplifiers are coupled to bit lines of the first and the last memory sub-arrays, respectively, and wherein reference bit lines are not provided for the first and the last related sense-amplifiers.

24. The memory-chip according to claim 23, wherein one dimension of a chip-area of the memory chip is terminated by a column of the first sense-amplifiers and a column of the last sense-amplifiers, respectively, the columns of the first and last sense-amplifiers extending in a second dimension that is different from the first dimension.

25. A method for accessing a logical content of a memory cell, the memory cell comprising a cell capacity for storing a charge related to the logical content, wherein the cell capacity is connected between a bit line having a bit line capacity and a reference potential, the method comprising:

providing a reference node having a reference capacity that is smaller than the bit line capacity; and changing a potential of the bit line and the reference node, in case of a read or write access of the memory cell, wherein the change of the potential of the bit line is conducted with a first current and the change of the potential of the reference node is conducted with a second current, wherein the first current is greater than the second current.

* * * * *